United States Patent
Lee et al.

(10) Patent No.: US 7,768,115 B2
(45) Date of Patent: *Aug. 3, 2010

(54) STACK CHIP AND STACK CHIP PACKAGE HAVING THE SAME

(75) Inventors: Jong-Joo Lee, Gyeonggi-do (KR); Dong-Ho Lee, Gyeonggi-do (KR)

(73) Assignee: Samsung Electronics Co., Ltd., Yeongtong-gu, Suwon-si, Gyeonggi-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 12/267,343

(22) Filed: Nov. 7, 2008

(65) Prior Publication Data

US 2009/0065950 A1 Mar. 12, 2009

Related U.S. Application Data

(63) Continuation of application No. 11/627,791, filed on Jan. 26, 2007, now Pat. No. 7,462,930.

(30) Foreign Application Priority Data

Jan. 26, 2006 (KR) .................................. 2006-8304

(51) Int. Cl.
*H01L 23/02* (2006.01)
(52) U.S. Cl. ........................ 257/686; 257/685; 257/777; 257/E25.005; 257/E25.006; 257/E25.021; 257/E25.027; 257/E23.085
(58) Field of Classification Search .................. 257/686, 257/777
See application file for complete search history.

(56) References Cited

U.S. PATENT DOCUMENTS 5,323,060 A 6/1994 Fogal et al.

(Continued)

FOREIGN PATENT DOCUMENTS

KR 2003-0000529 1/2003

(Continued)

OTHER PUBLICATIONS

English language abstract of Korean Publication No. 2003-0000529.

(Continued)

*Primary Examiner*—Jasmine J Clark
(74) *Attorney, Agent, or Firm*—Muir Patent Consulting, PLLC (57) ABSTRACT

Provided are a stack chip and a stack chip package having the stack chip. Internal circuits of two semiconductor chips are electrically connected to each other through an input/output buffer connected to an external connection terminal. The semiconductor chip has chip pads, input/output buffers and internal circuits connected through circuit wirings. The semiconductor chip also has connection pads connected to the circuit wirings connecting the input/output buffers to the internal circuits. The semiconductor chips include a first chip and a second chip. The connection pads of the first chip are electrically connected to the connection pads of the second chip through electrical connection means. Input signals input through the external connection terminals are input to the internal circuits of the first chip or the second chip via the chip pads and the input/output buffers of the first chip, and the connection pads of the first chip and the second chip.

20 Claims, 10 Drawing Sheets

U.S. PATENT DOCUMENTS

| | | | |
|---|---|---|---|
| 5,973,403 A | 10/1999 | Wark | |
| 6,407,451 B2 | 6/2002 | Akram et al. | |
| 6,429,096 B1 | 8/2002 | Yanagida | |
| 7,355,273 B2 | 4/2003 | Jackson et al. | |
| 7,462,930 B2 * | 12/2008 | Lee et al. | 257/686 |
| 2003/0096454 A1 | 5/2003 | Poo et al. | |
| 2006/0001177 A1 | 1/2006 | Hubner | |

FOREIGN PATENT DOCUMENTS

| | | |
|---|---|---|
| KR | 2003-0018642 | 3/2003 |
| KR | 2004-0091580 | 10/2004 |

OTHER PUBLICATIONS

English language abstract of Korean Publication No. 2003-0018642.
English language abstract of Korean Publication No. 2004-0091580.

* cited by examiner

STACK CHIP AND STACK CHIP PACKAGE HAVING THE SAME

CROSS-REFERENCE TO RELATED PATENT APPLICATION

This application is a Continuation of U.S. patent application Ser. No. 11/627,791, filed on Jan. 26, 2007, now pending, which claims priority from Korean Patent Application No. 2006-8304 filed on Jan. 26, 2006, all of which are hereby incorporated by reference in their entirety.

BACKGROUND

1. Technical Field

The invention relates to a semiconductor packaging technique and, more particularly, to a stack chip and a semiconductor package having the stack chip.

2. Description of the Related Art

Memory product development, for example DRAM development, has been focused on moving towards increased speed and capacity. One method for improving capacity is a chip stacking technique that may be used to stack semiconductor chips on a limited area of a package. The chip stacking may increase capacity of a product corresponding to the number of the semiconductor chips used.

In semiconductor packages manufactured by chip stacking, chip pads of semiconductor chips may be electrically connected to external connection terminals by, for example, wire bonding, a combination of wire bonding and flip chip bonding, or through electrodes.

Figure 1:
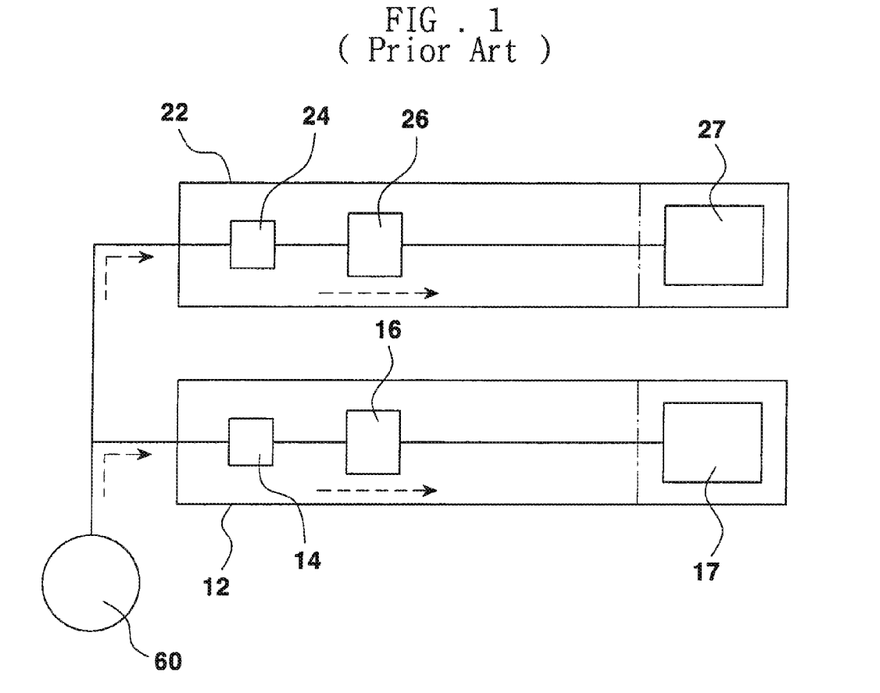
FIG. 1 is a circuit diagram of a conventional stack chip.
Figure 2:
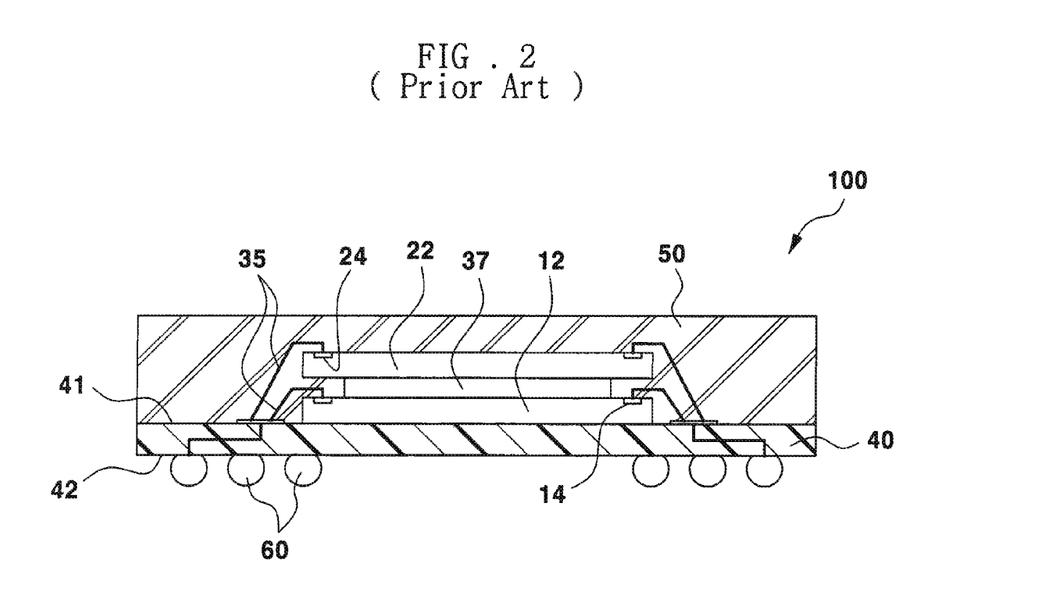
FIG. 2 is a cross-sectional view of a semiconductor package having the stack chip of FIG. 1.

Referring to FIGS. 1 and 2, a conventional dual die package 100 includes a wiring substrate 40 having an upper surface 41 and a lower surface 42, a lower semiconductor chip 12 having chip pads 14, and an upper semiconductor chip 22 having chip pads 24. The lower semiconductor chip 12 is mounted on the upper surface 41 of the wiring substrate 40. The upper semiconductor chip 22 is stacked on the lower semiconductor chip 12 with a spacer 37 interposed therebetween. Bonding wires 35 electrically connect the chip pads 14 and 24 of the semiconductor chips 12 and 22 to the wiring substrate 40. An encapsulant 50 seals the semiconductor chips 12 and 22 and the bonding wires 35. External connection terminals 60, for example solder balls, are formed on the lower surface 42 of the wiring substrate 40. The external connection terminals 60 are electrically connected to the chip pads 14 and 24 of the semiconductor chips 12 and 22.

Signals input through the external connection terminals 60 are transmitted to internal circuits 17 and 27 of the semiconductor chips 12 and 22 through the chip pads 14 and 24, and input/output buffers 16 and 26 of the semiconductor chips 12 and 22, respectively.

Compared to a semiconductor package having a single semiconductor chip (hereinafter referred to as a single die package), the dual die package 100 has double the number of semiconductor chips, but is provided with the same number of external connection terminals. Typically, input capacitive loading may increase corresponding to the number of semiconductor chips within a chip stack. Double input capacitive loading of the dual die package 100 may cause reduced speed of the package 100. Particularly, input capacitive loading may relate to the number of input/output buffers 16 and 26 configured to connect the chip pads 14 and 24 to the internal circuits 17 and 27. In the dual die package 100, each of the external connection terminals 60 may be connected to two input/output buffers 16 and 26 in parallel. As a result, input capacitive loading of the dual die package 100 may increase, thereby reducing the speed of the package 100. The increased input capacitive loading may reduce the valid window size of data at the channel and/or system level. Therefore, reduction of signal integrity may prevent high speed operation of the semiconductor package and/or the system.

Consequently, a dual die package with reduced capacitive loading is desired so that high speed operation can still be achieved when capacity is increased.

SUMMARY

Embodiments of the invention reduce the input capacitive loading of a semiconductor package to improve the speed and capacity of the package. The embodiments also reduce the number of standby input/output buffers and prevent reduction of the valid window size of data at the system level to improve the signal integrity of the package.

BRIEF DESCRIPTION OF THE DRAWINGS

The example embodiments of the invention will be readily understood with reference to the following detailed description thereof in conjunction with the accompanying drawings, wherein like reference numerals designate like structural elements.

These drawings are for illustrative purposes only and are not drawn to scale. The spatial relationships and relative sizing of the elements illustrated in the various embodiments may have been reduced, expanded or rearranged to improve the clarity of the figures with respect to the corresponding description. The figures, therefore, should not be interpreted as accurately reflecting the relative sizing or positioning of the corresponding structural elements that could be encompassed by an actual device manufactured according to the example embodiments of the invention.

DETAILED DESCRIPTION

Example, non-limiting embodiments of the invention are described more fully hereinafter with reference to the accompanying drawings. This invention may, however, be embodied in many different forms and should not be construed as limited to the example embodiments set forth herein. Rather, the disclosed embodiments are provided so that this disclosure will be thorough and complete, and will fully convey the scope of the invention to those skilled in the art. The principles and features of this invention may be employed in varied and numerous embodiments without departing from the scope of the invention.

It should be noted that the figures are intended to illustrate the general characteristics of methods and devices of example embodiments of this invention, for the purpose of the description of such example embodiments herein. These drawings are not, however, to scale and may not precisely reflect the characteristics of any given embodiment, and should not be interpreted as defining or limiting the range of values or properties of example embodiments within the scope of this invention. Rather, for simplicity and clarity of illustration, the dimensions of some of the elements are exaggerated relative to other elements.

Further, well-known structures and processes are not described or illustrated in detail to avoid obscuring the invention. Like reference numerals are used for like and corresponding parts of the various drawings.

Figure 3:
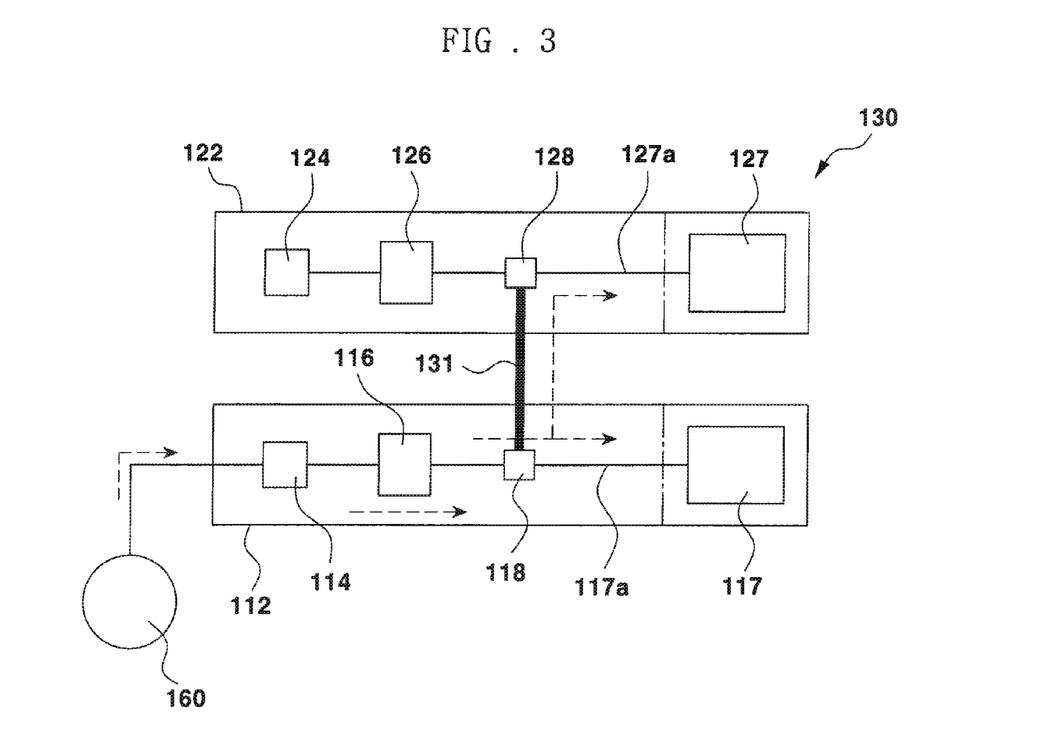
FIG. 3 is a circuit diagram of a stack chip in accordance with an example, non-limiting embodiment of the invention.

FIG. 3 is a circuit diagram of a stack chip 130 in accordance with a first example embodiment of the invention.

Referring to FIG. 3, in the stack chip 130, internal circuits 117 and 127 of semiconductor chips 112 and 122 may be connected to each other through a single input/output buffer 116 connected to an external connection terminal 160. In each of the semiconductor chips 112 and 122, chip pads 114 and 124, input/output buffers 116 and 126, and internal circuits 117 and 127 may be connected by wirings. Connection pads 118 and 128 may be formed on active surfaces of the semiconductor chips 112 and 122. The connection pads 118 and 128 may be connected to circuit wirings 117a and 127a configured to connect the input/output buffers 116 and 126 to the internal circuits 117 and 127, respectively. Electrical connection means 131 may electrically connect the connection pads 118 and 128 of the semiconductor chips 112 and 122 to each other. The semiconductor chips 112 and 122 may include a first chip 112 and a second chip 122. A first chip pad 114 of the first chip 112 may be electrically connected to the external connection terminal 160. The chip pads 114 and 124 are input/output pads.

The flow of input/output signals of the stack chip 130 is described below. After input signals are transmitted to the first chip pad 114 of the first chip 112 through the external connection terminal 160, the signals may be transmitted to the first input/output buffer 116 of the first chip 112 and then input to a first internal circuit 117 of the first chip 112 or a second internal circuit 127 of the second chip 122 through a first connection pad 118 and a second connection pad 128. For example, input signals may be input to the first internal circuit 117 of the first chip 112, or to the second internal circuit 127 of the second chip 122 through the first connection pad 118 of the first chip 112, the electrical connection means 131, and the second connection pad 128 of the second chip 122.

After output signals are output to the first input/output buffer 116 through the first internal circuit 117 or the second internal circuit 127, the signals may be output to the external connection terminal 160 through the first chip pad 114. For example, output signals of the first internal circuit 117 may be output to the external connection terminal 160 through the first input/output buffer 116 and the first chip pad 114. Output signals of the second internal circuit 127 may be output to the external connection terminal 160 through the second connection pad 128, the electrical connection means 131, the first connection pad 118, the first input/output buffer 116, and the first chip pad 114 of the first chip 112.

The second chip pads 124 and the second input/output buffer 126 of the second chip 122 may not function as input/output terminals after packaging is completed.

Therefore, input capacitive loading of the stack chip 130 may be the same or similar to that of a single die package because signals are routed through a single input/output buffer 116 for both of the semiconductor chips 112 and 122. Thereby, the stack chip 130 may have improved capacity and speed.

Figure 4:
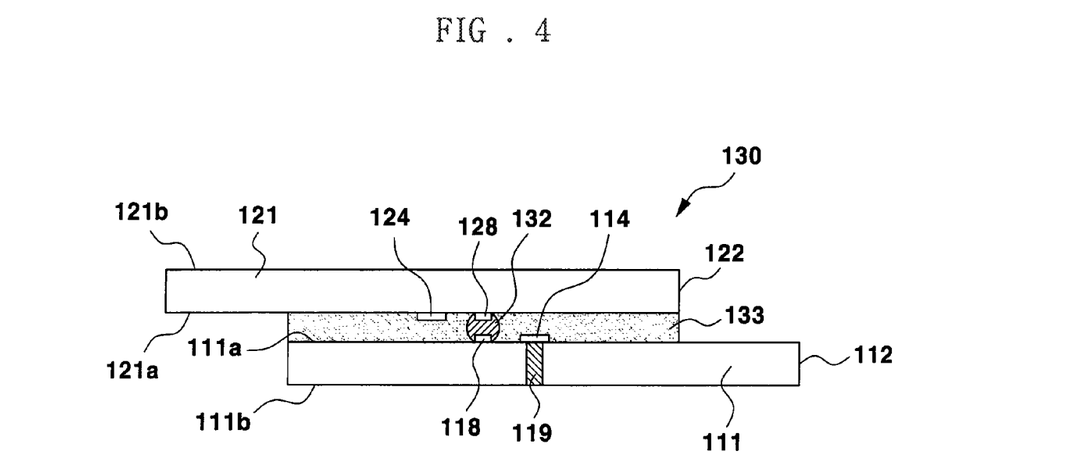
FIG. 4 is a cross-sectional view of a stack chip having the circuitry of FIG. 3.
Figure 5:
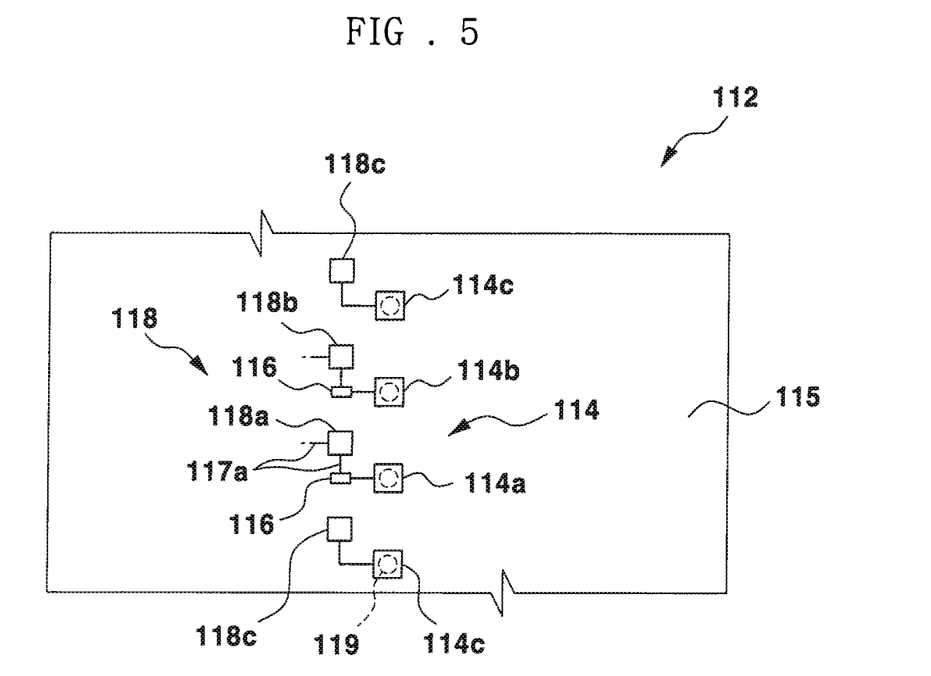
FIG. 5 is a plan view of a first chip of the stack chip of FIG. 4.
Figure 6:
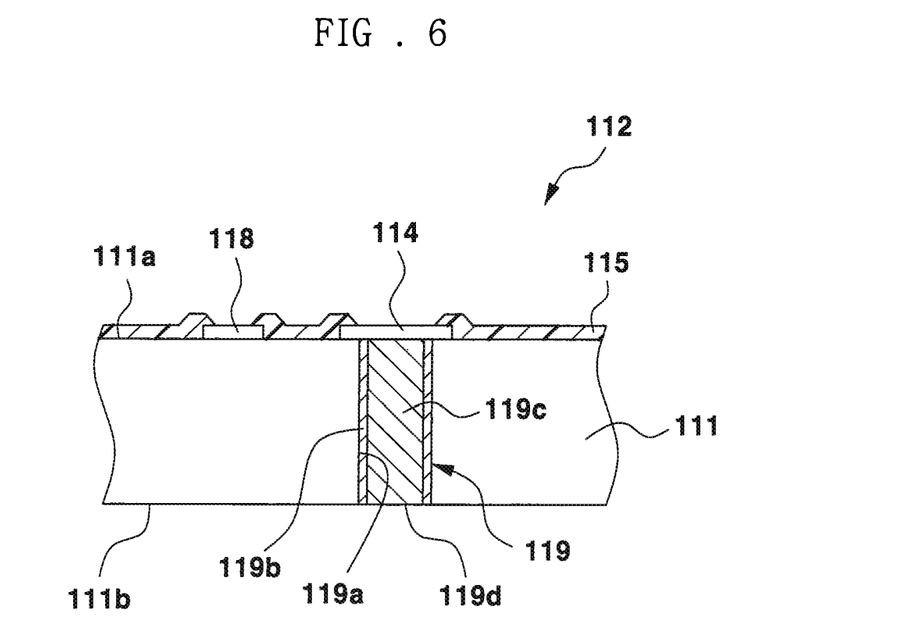
FIG. 6 is a cross-sectional view of FIG. 5.

FIG. 4 is a cross-sectional view of a stack chip 130 having the circuitry of FIG. 3. FIG. 5 is a plan view of a first chip 112 of the stack chip of FIG. 4. FIG. 6 is a cross-sectional view of FIG. 5.

Referring to FIGS. 4 to 6, the stack chip 130, for example a dual chip may have semiconductor chips 112 and 122 stacked face-to-face. A lower semiconductor chip 112 may have an active surface 111a with a first connection pad 118. An upper semiconductor chip 122 may have an active surface 121a with a second connection pad 128. The first connection pad 118 may be electrically connected to the second connection pad 128 through electrical connection means, for example a metal bump 132. A filling layer 133 may be interposed between the lower semiconductor chip 112 and the upper semiconductor chip 122. The filling layer 133 may be used in protecting the metal bump 132. At least one semiconductor chip, for example the lower semiconductor chip 112 may have a first through electrode 119 connected to a chip pad 114.

Specifically, the stack chip 130 may include a first chip 112 and a second chip 122 stacked on the first chip 112. The first chip 112 may have an active surface 111a and a back surface 111b. The second chip 122 may have an active surface 121a and a back surface 121b. The active surface 111a of the first chip 112 may face the active surface 121a of the second chip 122. Since the second chip 122 has the similar structure to the first chip 112, the chip structure is described based on the first chip 112.

The first chip 112 may comprise a semiconductor substrate 111, e.g., silicon substrate, having the active surface 111a with a first chip pad 114 and a first connection pad 118, and the back surface 111b opposite to the active surface 111a. A passivation layer 115 may cover the active surface 111a, except for the first chip pad 114 and the first connection pad 118. A first integrated circuit (not shown) may be formed in the semiconductor substrate 111. The first chip pad 114 may be electrically connected to the first integrated circuit. The first chip pad 114 may be formed from materials having good electrical conductivity, for example Al or Cu. The passivation layer 115 may be formed from oxide, nitride or a combination thereof. The passivation layer 115 may protect the first integrated circuit from the external environment.

The first chip pad 114 may include input/output pads 114a and 114b and a power/ground pad 114c. The input/output pads 114a and 114b may include a high-speed pad 114a and a low-speed pad 114b. A first input/output buffer 116 may connect the input/output pads 114a and 114b to the first internal circuit.

The first connection pad 118 may include input/output connection pads 118a and 118b connected to the input/output pads 114a and 114b, and a power/ground connection pad 118c connected to the power/ground pad 114c. The first connection pad 118 may be formed using redistribution through a fabrication process. The input/output connection pads 118a and 118b may be formed on the active surface 111a and may be connected to a circuit wiring 117a configured to connect the input/output buffer 116 and the first internal circuit. The input/output connection pads 118a and 118b may include a high-speed connection pad 118a connected to the high-speed pad 114a and a low-speed connection pad 118b connected to the low-speed pad 114b.

Although this example embodiment shows the high-speed and low-speed connection pads 118a and 118b connected to the circuit wiring 117a connecting the first input/output buffer 116 to the first internal circuit, the high-speed connection pad 118a may be only connected to a circuit wiring connecting the first input/output buffer to the first internal circuit.

The power/ground connection pad 118c may be formed on the active surface 111a in conformity with the input/output connection pads 118a and 118b.

The first chip pad 114 may be arranged in the center of the active surface 111a of the first chip 112 in one or two rows. The first connection pad 118 may be spaced away from the first chip pad 114. The second chip 122 may be offset from the first chip 112. As the degree of offset increases, a mounting area of a resulting semiconductor package may increase. Therefore, the degree of offset may be reduced to, for example about 100 μm, for a semiconductor package having a small mounting area.

The metal bump 132 may connect the first connection pad 118 to the second connection pad 128. The metal bump 132 may include a solder bump, Au bump, or Ni bump. The face-to-face stack of the first chip 112 and second chip 122 may reduce the distance between the first connection pad 118 and the second connection pad 128.

The filling layer 133 may be interposed between the first chip 112 and the second chip 122 and be used in protecting the metal bump 132. The filling layer 133 may include an epoxy or a silicone based resin.

Although this example embodiment shows the metal bump 132 as an electrical connection means, the metal bump 132 may be replaced with an anisotropic conductive film (ACF). The use of ACF may eliminate a process for forming a filling layer.

The first through electrode 119 may be formed through the first chip 112 and be connected to the first chip pad 114. The first through electrode 119 may electrically connect the stack chip 130 to the external connection terminal. The first through electrode 119 may have a connection end 119d exposed from the back surface 111b of the first chip 112. The first through electrode 119 may be formed by providing conductive material 119c in a through hole 119a. The through hole 119a may be connected to the first chip pad 114. An insulating layer 119b may be formed between the through hole 119a and the conductive material 119c. The insulating layer 119b may serve as an insulator between the conductive material 119c and the semiconductor substrate 111.

Figure 16:
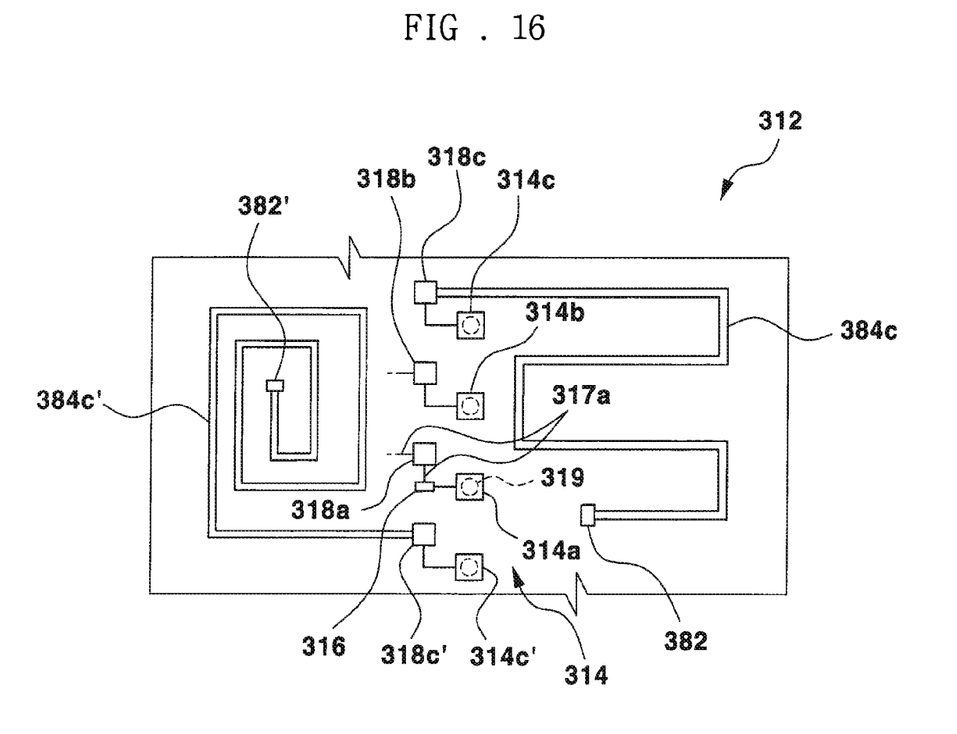
FIG. 16 is a plan view of a semiconductor chip of a stack chip having the circuitry of FIG. 3 in accordance with another example, non-limiting embodiment of the invention.

Although this example embodiment shows the first connection pad 118 formed using redistribution through a fabrication process, the first connection pad 118 may be formed by a wafer level redistribution process as shown in FIG. 16.

FIGS. 7 to 12 are cross-sectional views illustrating steps of an example method for manufacturing the stack chip 130 of FIG. 4.

Figure 7:
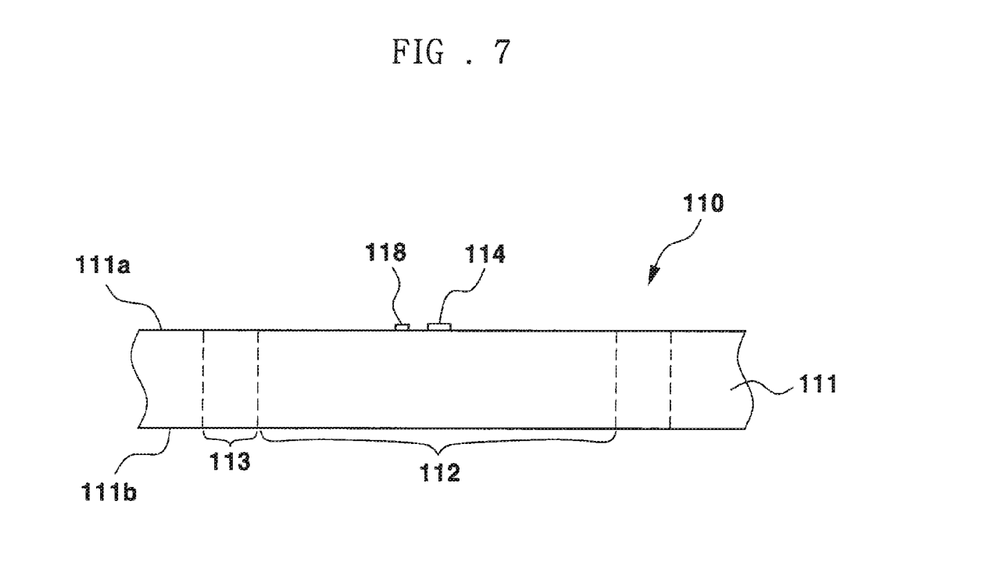
FIGS. 7 to 12 are cross-sectional views illustrating a method for manufacturing the stack chip of FIG. 4.

Referring to FIG. 7, a first wafer 110 and a second wafer 120 may be prepared. Since the second wafer 120 has the same structure as the first wafer 110, only the first wafer 110 is illustrated in the drawing.

The first wafer 110 may have an active surface 111a and a back surface 111b opposite to the active surface 111a. The first wafer 110 may comprise a plurality of first chips 112. First scribe regions 113 may be formed between the adjacent first chips 112. The first chip 112 may have first chip pads 114 arranged in the center of the active surface 111a. First connection pads 118 may be spaced away from the first chip pads 114. The first wafer 110 may have a backlapped thickness of about 700 μm and a diameter of 8 inches or 12 inches.

Figure 8:
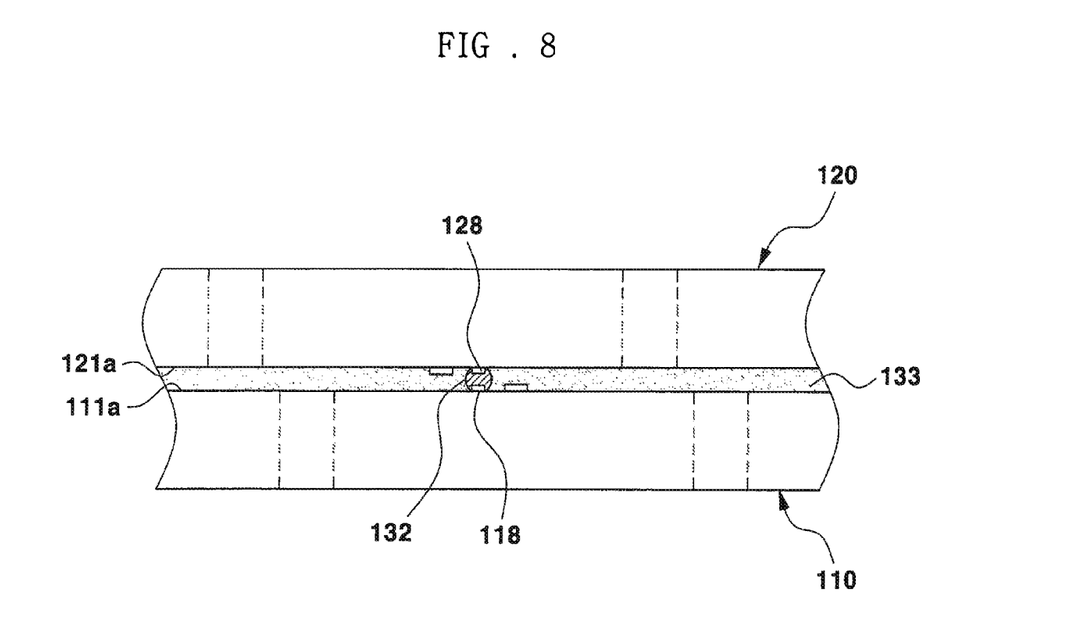

Referring to FIG. 8, the second wafer 120 may be stacked on the first wafer 110. The active surface 111a of the first wafer 110 may face the active surface 121a of the second wafer 120. A metal bump 132 may connect the first connection pad 118 to a second connection pad 128. A filling layer 133 may be interposed between the first wafer 110 and the second wafer 120. The second wafer 120 may be offset from the first wafer 110.

Figure 9:
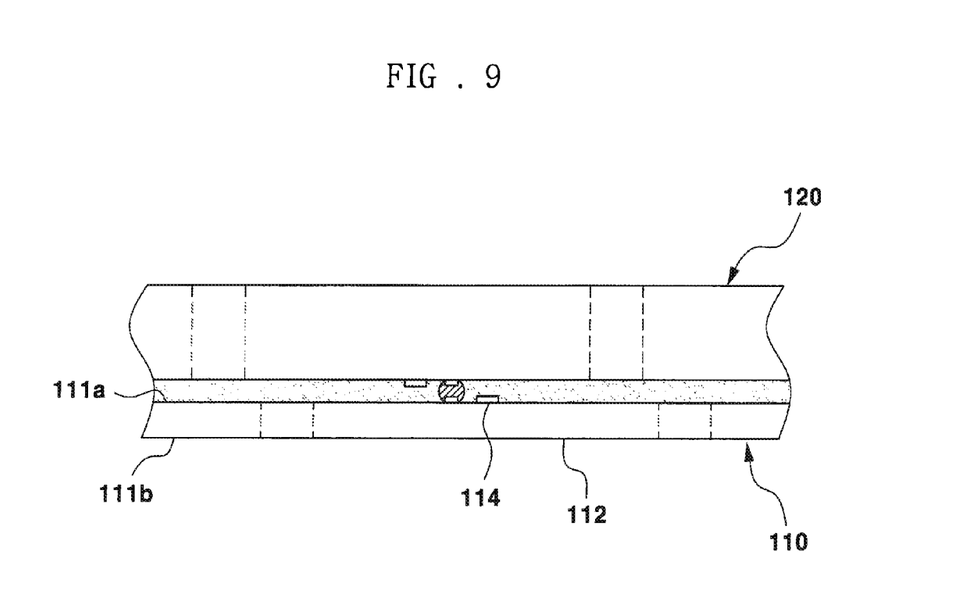

Referring to FIG. 9, the back surface 111b of the first wafer 110 may be backlapped. A backlapping process may be implemented by a grinding method, an etching method or a chemical mechanical polishing method.

The backlapping process may allow for a thinner stack chip and easy formation of a first through electrode. For example, the thickness of the first wafer 110 is initially 700 μm, and after a backlapping process the thickness of the first wafer 110 may be 100 μm or less, if reasonable operation of the first chip 112 and processing techniques permit.

Figure 10:
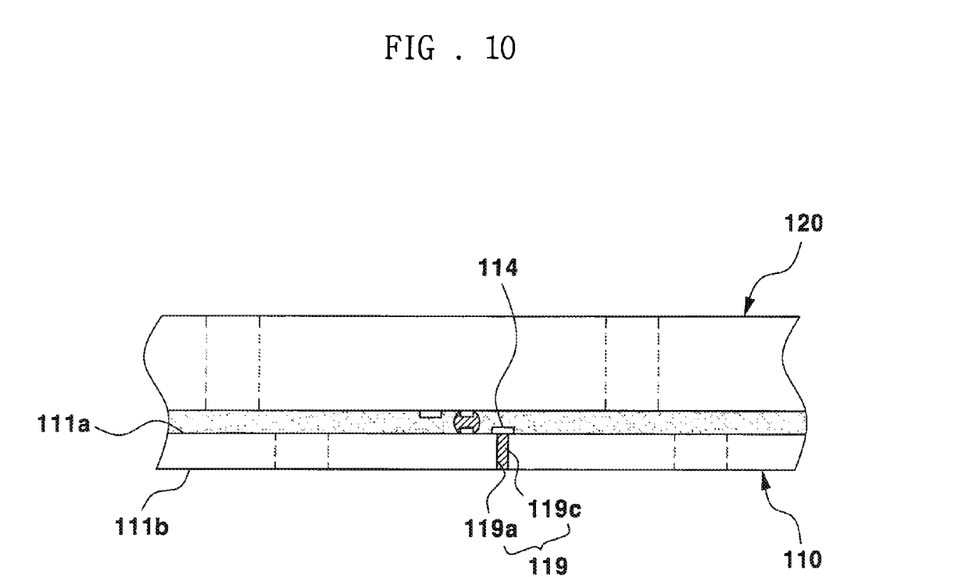

Referring to FIG. 10, a first through electrode 119 may be formed through the first wafer 110. A through hole 119a may be formed from the back surface 111b towards the first chip pad 114. The through hole 119a may be formed in the shape of a cylinder or a multi-sided pillar. The shape of the through hole 119a is not limited in this regard. For example, the diameter of the through hole 119a at the back surface 111b may be larger than the diameter of the through hole 119a at the chip pad 114 using a directional etching method of crystalline silicon. Conductive material 119c may be filled in the through hole 119a to form the first through electrode 119.

Figure 11:
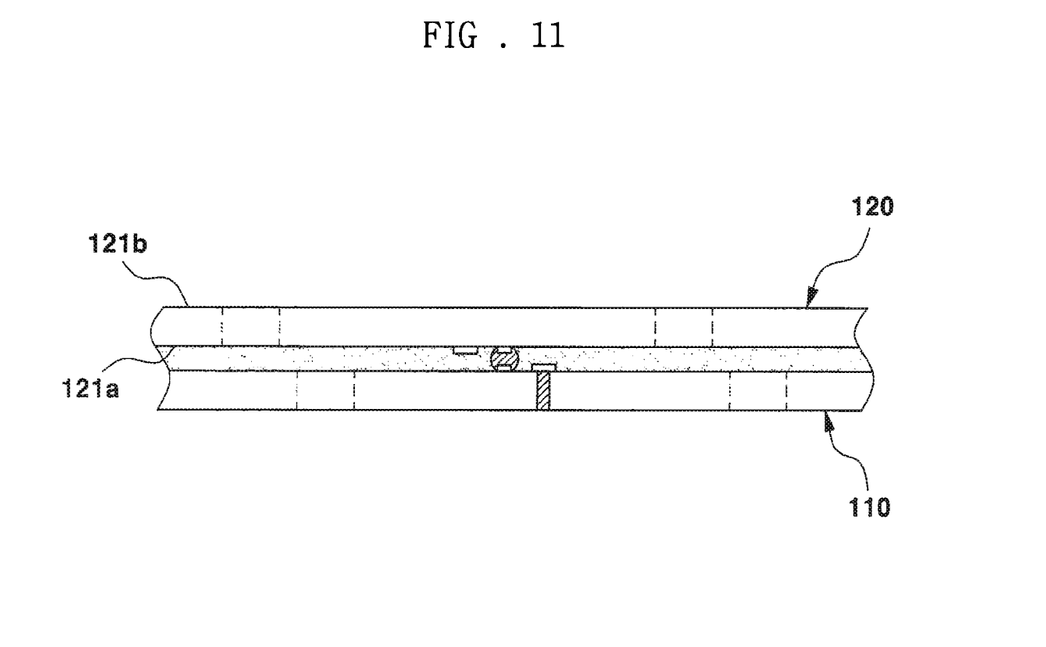

Referring to FIG. 11, a back surface 121b of the second wafer 120 may be backlapped. The second wafer backlapping process may be performed in the same manner as the first wafer backlapping process.

Figure 12:
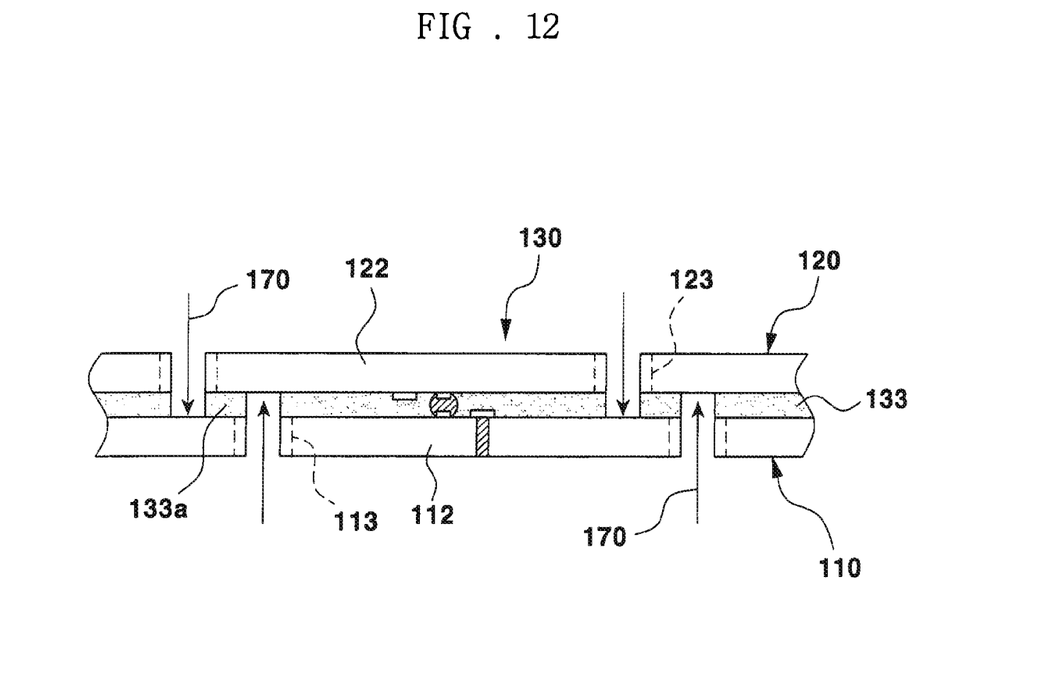

Referring to FIG. 12, a stack of the first wafer 110 and the second wafer 120 may be divided into individual stack chips 130. The first chips 112 and the second chips 122 may be singulated using a sawing blade 170 along the scribe regions 113 and 123.

A singulation process may be performed through one or two sawing operations according to the degree of offset between the first wafer 110 and the second wafer 120. For example, if the scribe regions 113 of the first wafer 110 do not overlap with the scribe regions 123 of the second wafer 120 as shown in FIG. 12, or if overlapping areas are smaller than areas to be cut by the sawing blade 170, even though the scribe regions 113 of the first wafer 110 overlap with the scribe regions 123 of the second wafer 120, a singulation process may be performed through two sawing operations, each sawing operation being on the first wafer 110 and the second wafer 120.

On the other hand, if the overlapping areas are larger than areas to be cut by the sawing blade 170, a singulation process may be performed through a single sawing operation. In this case, it is also possible to perform the singulation process through two sawing operations.

In alternative embodiments, the stack chip 130 may be fabricated at chip level. For example, a first wafer having through electrodes, each through electrode having a connection end exposed from a back surface may be prepared. A backlapped second wafer may be prepared. The first wafer may be divided into individual first chips and the second wafer may be divided into individual second chips. The second chip may be stacked on the first chip such that an active surface of the first chip may face an active surface of the second chip. First connection pads may be electrically connected to second connection pads using metal bumps. A filling layer may be interposed between the first chip and the second chip.

In alternative embodiments, individual second chips may be stacked on a first wafer, individual first chips may be stacked on a second wafer, or after a first chip may be mounted on a wiring substrate, a second chip may be stacked on the first chip.

Figure 13:
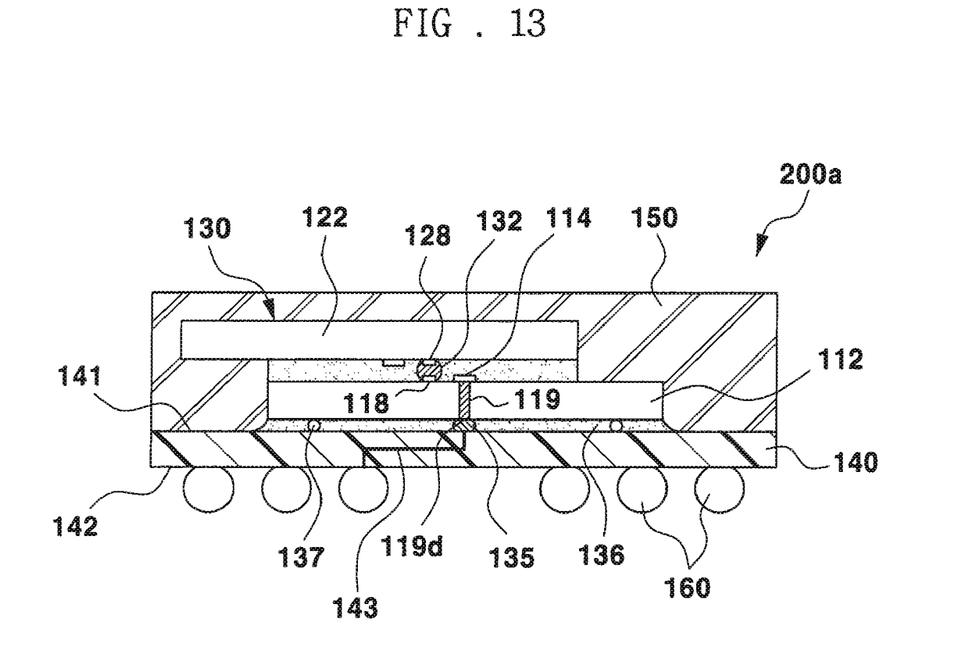
FIG. 13 is a cross-sectional view of an example semiconductor package having the stack chip of FIG. 4.

FIG. 13 is a cross-sectional view of an example semiconductor package 200a having the stack chip 130 of FIG. 4.

Referring to FIG. 13, the semiconductor package 200a as a ball grid array (BGA) semiconductor package may include a wiring substrate 140 having an upper surface 141 with a connection bump 135 and a lower surface 142 with an external connection terminal 160. The stack chip 130 may be mounted on the upper surface 141 of the wiring substrate 140 using the connection bump 135.

Specifically, a connection end 119d of a first through electrode 119 of the stack chip 130 may be bonded to the upper surface 141 of the wiring substrate 140 via the connection bump 135. For example, the stack chip 130 may be mounted on the upper surface 141 of the wiring substrate 140 using a flip chip bonding method. A filling layer 136 may be interposed between the stack chip 130 and the wiring substrate 140 to protect the metal bump 135 from the external environment. The connection bump 135 may include a solder bump, Au bump, or Ni bump. The filling layer 136 may be formed using an underfill process. Spacers 137 may be arranged along the periphery between the stack chip 130 and the upper surface 141 of the wiring substrate 140. The use of the spacers 137 may allow for stable mounting of the stack chip 130 on the wiring substrate 140. The diameter of the spacer 137 may correspond to the height of the connection bump 135.

The wiring substrate 140 may include a printed circuit board, a tape wiring substrate, a ceramic wiring substrate, a silicon wiring substrate, or a lead frame.

An encapsulant 150 may seal the upper surface 141 of the wiring substrate 140 to protect the stack chip 130 from the external environment.

External connection terminals 160 may be provided on the lower surface 142 of the wiring substrate 140. An internal wiring 143 of the wiring substrate 140 may electrically connect the external connection terminal 160 to the connection bump 135. The external connection terminals 160 may include solder balls.

Because a first connection pad 118 is electrically connected to a second connection pad 128 using a metal bump 132 and the first through electrode 119 located on the first chip pad 114 is electrically connected to the external connection terminal 160, after input signals are input to the first chip pad 114 through the external connection terminal 160, the signals may be input to internal circuits of the first chip 112 or the second chip 122 through an input/output buffer of the first chip 112 and the first and second connection pads 118 and 128. Thereby, the semiconductor package of the invention may incorporate the level of input capacitive loading of a single die package, resulting in higher speed of the package.

Figure 14:
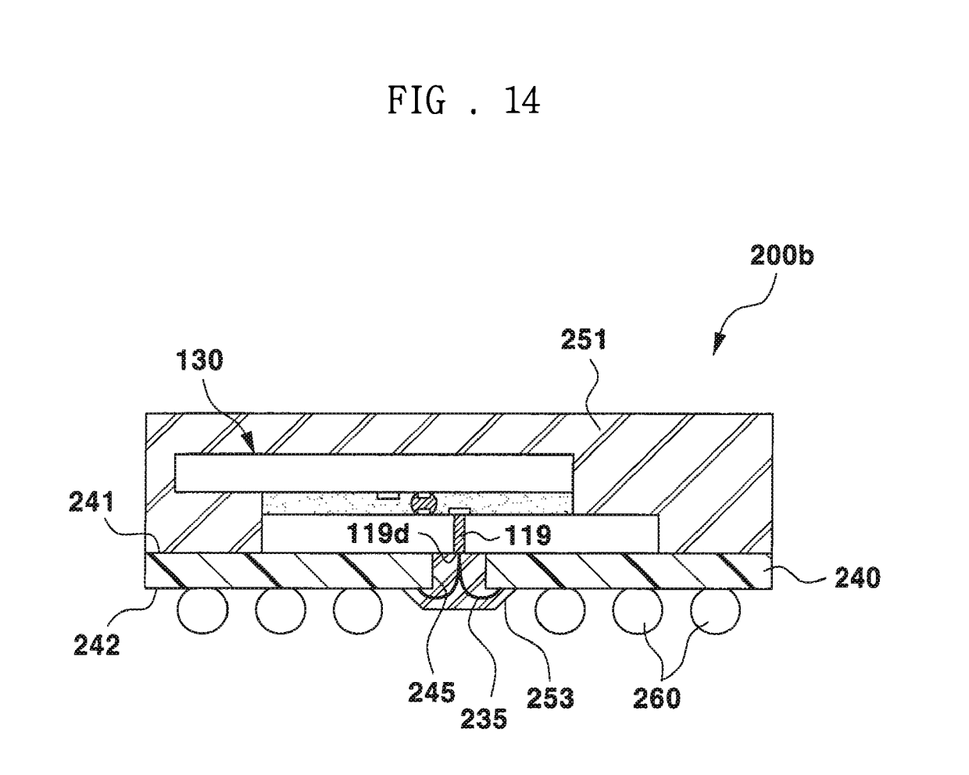
FIG. 14 is a cross-sectional view of another example semiconductor package having the stack chip of FIG. 4.

FIG. 14 is a cross-sectional view of another example semiconductor package 200b having the stack chip 130 of FIG. 4.

Referring to FIG. 14, the semiconductor package 200b as a board on chip (BOC) semiconductor package may include a wiring substrate 240 having an upper surface 241 and a lower surface 242. The wiring substrate 240 may have a central window 245.

The stack chip 130 may be mounted on the upper surface 241 of the wiring substrate 240 such that a connection end 119d of a first through electrode 119 of the stack chip 130 may be exposed through the central window 245 of the wiring substrate 240.

Bonding wires 235 may electrically connect the connection end 119d of the first through electrode 119 to the wiring substrate 240 through the central window 245.

An encapsulant 251 and 253 may seal the stack chip 130 and the bonding wires 235 to protect them from the external environment. The encapsulant 251 and 253 may include a first encapsulant 251 for the stack chip 130 and a second encapsulant 253 for the bonding wires 235. The first encapsulant 251 may be formed simultaneously with or separately from the second encapsulant 253.

External connection terminals 260 may be provided on the lower surface 242 of the wiring substrate 240, clear of the second encapsulant 253. The external connection terminals 260 may be electrically connected to the first through electrode 119 through the wiring substrate 240 and the bonding wires 235. The height of the external connection terminal 260 may be greater than the height of the second encapsulant 253 above the back surface 242 of the wiring substrate 240, so that the semiconductor package 200b may be mounted on a mother board. The external connection terminals 260 may include solder balls.

In alternative embodiments, the semiconductor package 200b may be a lead on chip (LOC) semiconductor package in which a lead frame is used as a wiring substrate.

Figure 15:
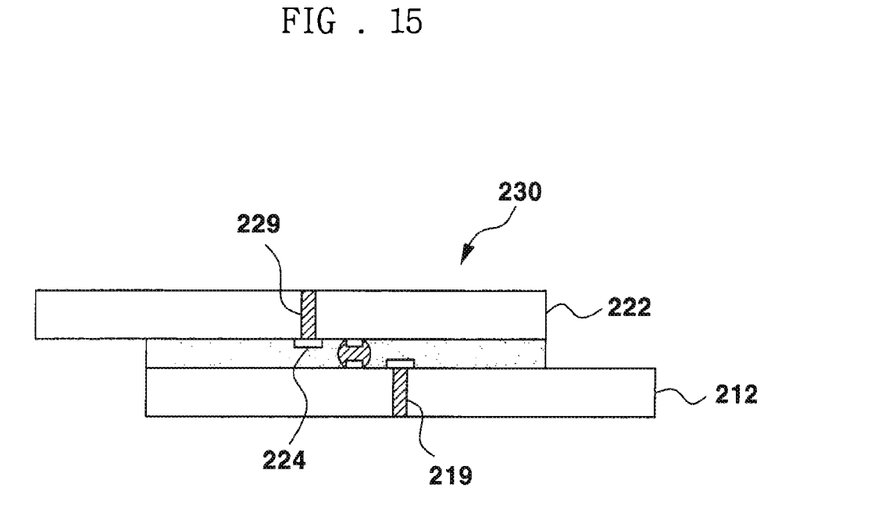
FIG. 15 is a cross-sectional view of a stack chip having the circuitry of FIG. 3 in accordance with another example, non-limiting embodiment of the invention.

FIG. 15 is a cross-sectional view of a stack chip 230 having the circuitry of FIG. 3 in accordance with a second example embodiment of the invention. The stack chip 230 of this example embodiment has the same structure as the stack chip 130, except for having a second through electrode 229.

Referring to FIG. 15, the stack chip 230 may have the second through electrode 229 formed through a second chip 222 and connected to a second chip pad 224.

The stack chip 230 may be fabricated at wafer level or chip level. For example, in the case of fabrication at wafer level, after two wafers having through electrodes are prepared, the wafers may be stacked face-to-face and divided into individual stack chips. In the case of fabrication at chip level, the stack chip 230 may be fabricated in the same manner as the stack chip 130, except for having a second through electrode.

Although this example embodiment shows high-speed and low-speed pads connected to connection pads, a high-speed pad may be only connected to a connection pad, as shown in FIGS. 16 to 19.

Figure 17:
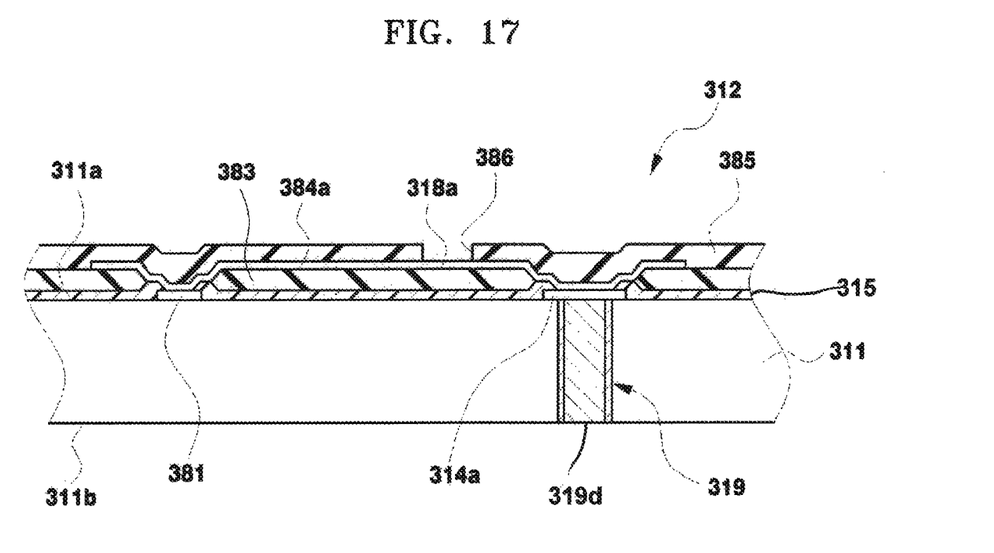
FIG. 17 is a cross-sectional view of redistribution for a high-speed pad of the semiconductor chip of FIG. 16.
Figure 18:
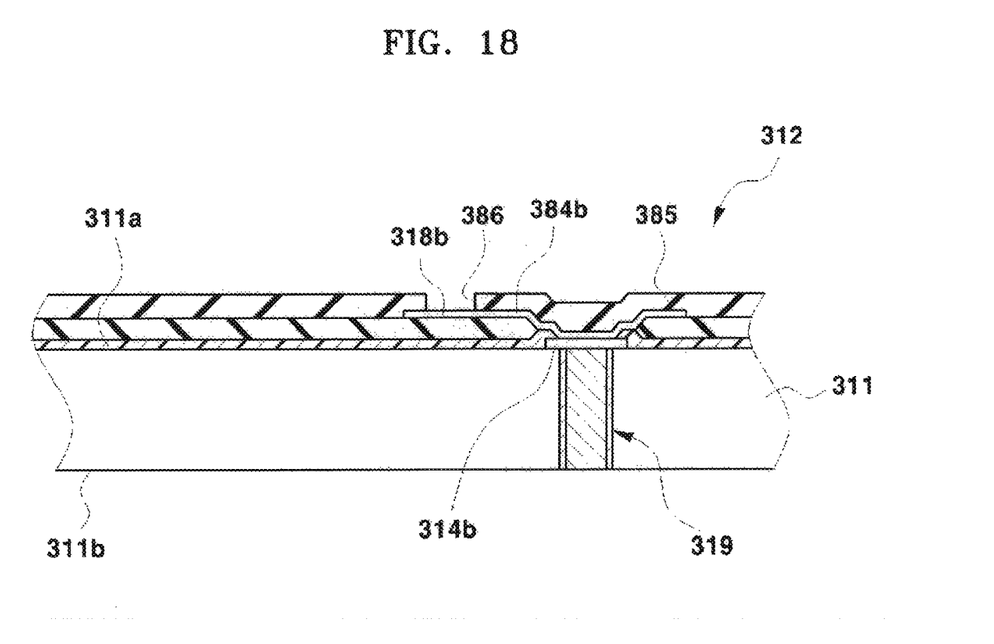
FIG. 18 is a cross-sectional view of redistribution for a low-speed pad of the semiconductor chip of FIG. 16.
Figure 19:
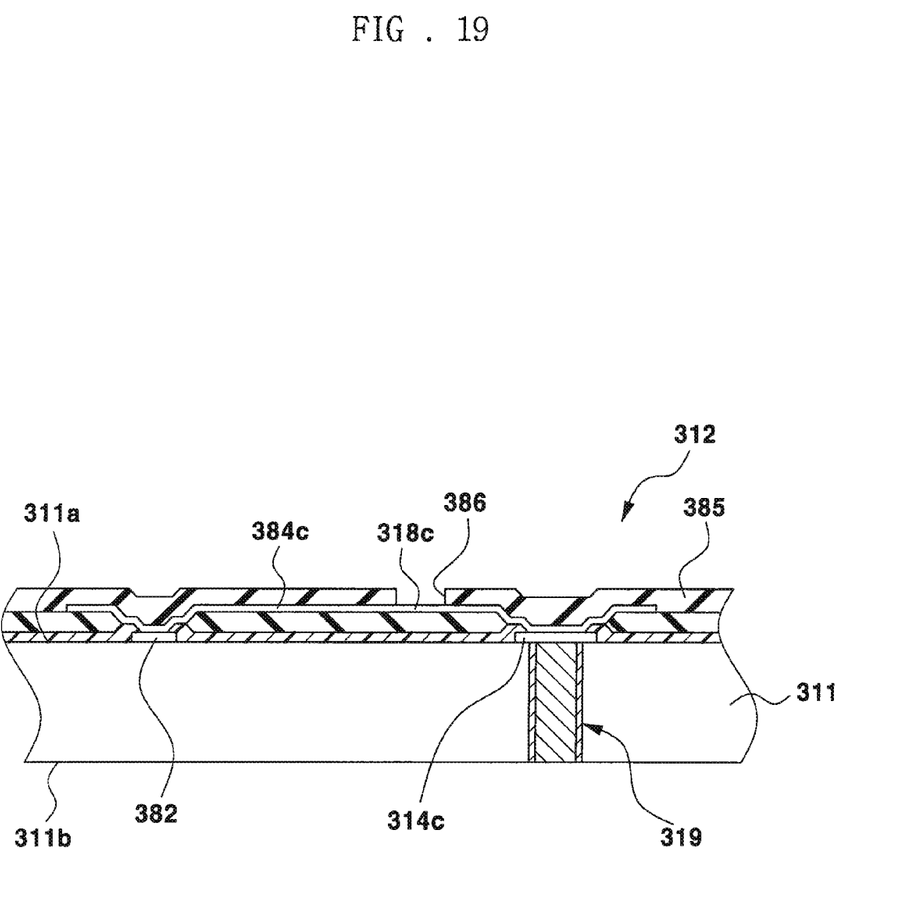
FIG. 19 is a cross-sectional view of redistribution for a power/ground pad of the semiconductor chip of FIG. 16.

FIG. 16 is a plan view of a semiconductor chip 312 of a stack chip having the circuitry of FIG. 3 in accordance with a third example embodiment of the invention. FIG. 17 is a cross-sectional view of redistribution for a high-speed pad 314a of the semiconductor chip 312 of FIG. 16. FIG. 18 is a cross-sectional view of redistribution for a low-speed pad 314b of the semiconductor chip 312 of FIG. 16. FIG. 19 is a cross-sectional view of redistribution for a power/ground pad 314c of the semiconductor chip 312 of FIG. 16.

Referring to FIGS. 16 to 19, the semiconductor chip 312 may have a connection pad 318 formed using a wafer level redistribution process. The semiconductor chip 312 of the first example embodiment may be a first chip, and the semiconductor chip 312 of the second example embodiment may be a first chip and a second chip.

As shown in FIGS. 16 and 17, a high-speed pad 314a of a chip pad 314 may be connected to a high-speed connection pad 318a formed through a wafer level redistribution process. An intermediate pad 381 may be provided on the active surface 311a and may be connected to a circuit wiring 317a configured to connect an input/output buffer 316 to an internal circuit. A passivation layer 315 may be provided on the active surface 311a, except for the intermediate pad 381 and the high-speed pad 314a. A first insulating layer 383 may be provided on the passivation layer 315 except for the intermediate pad 381. and the high-speed pad 314a. A redistribution layer 384a may be provided on the first insulating layer 383 including the intermediate pad 381. and the high-speed pad 314a. The redistribution layer 384a may have the high-speed connection pad 318a at one portion. A second insulating layer 385 may be provided on the first insulating layer 383 and may be used in protecting the redistribution layer 384a. The second insulating layer 385 may have an opening 386, through which the high-speed connection pad 318a may be exposed.

A through electrode 319 may be formed through the semiconductor chip 312 and be connected to the high-speed pad 314a. The through electrode 319 may have a connection end 319d exposed from the back surface 311b of the semiconductor chip 312.

Although this example embodiment shows the intermediate pad 381 formed on the active surface 311a, the redistribution layer 384a may be directly connected to the circuit wiring 317a.

As shown in FIGS. 16 and 18, the low-speed pad 314b of the chip pad 314 may be directly connected to a low-speed connection pad 318b without a connection pad connected to a circuit wiring configured to connect an input/output buffer to an internal circuit. The low-speed pad 314b may be exposed through the opening 386 of the second insulating layer 385 and be arranged in conformity with the high-speed pad 318a. Since the low-speed pad 314b is not affected by an increase of input capacitive loading, the low-speed connection pad 318b may be directly connected to the low-speed pad 314b.

The first through electrode 319 may be connected to the low-speed pad 314b.

As shown in FIGS. 16 and 19, a power/ground pad 314c of the chip pad 314 may be directly connected to a power/ground connection pad 318c formed using redistribution. The power/ground redistribution layer 384c may be connected to a power/ground pad 314c. The power/ground connection pad 318c may be exposed through the opening 386 of the second insulating layer 385. The power/ground connection pad 318c may be arranged in conformity with the high-speed connection pad 318a and the low-speed connection pad 318b.

The power/ground redistribution layer 384c may have a larger area than the other redistribution layers for stable power supply and ground. For example, power/ground redistribution layer 384c may be formed in the shape of a meander or a spiral.

The first through electrode 319 may be connected to the power/ground pad 314c.

In accordance with the example embodiments of the invention, internal circuits of two semiconductor chips may be connected to each other through an input/output buffer connected to an external connection terminal. Input signals input through the external connection terminal may be transmitted to the internal circuits of a first chip or a second chip via a chip pad and an input/output buffer of the first chip, and first and second connection pads. The semiconductor package of the invention may incorporate the level of input capacitive loading of a single die package, thereby improving signal integrity at the system level. The semiconductor package in accordance with the invention may have improved speed and capacity.

According to an example embodiment of the invention, a stack chip may have an upper semiconductor chip and a lower semiconductor chip stacked face-to-face. Each semiconductor chip may have a semiconductor substrate having an active surface and a back surface opposite to the active surface. Internal circuits may be formed in the active surface of the semiconductor substrate. Chip pads may be connected to the internal circuits, and may include input/out pads. Input/output buffers may connect the input/output pads to the internal circuits. Connection pads may be formed on the active surface of the semiconductor substrate and may be connected to the chip pads. The connection pads may include at least one input/output connection pad connected to the input/output buffer and the internal circuit. The connection pads of the lower semiconductor chip may be electrically connected to the connection pads of the upper semiconductor chip. At least one semiconductor chip may have first through electrodes connected to the chip pads. The first through electrode may have a connection end exposed from the back surface.

The semiconductor chips may include a first chip and a second chip stacked on at least the active surface of the first chip. The first through electrodes may be formed through the first chip and may be connected to chip pads of the first chip.

The connection pads of the semiconductor chips may be formed on the active surfaces of the semiconductor chips using redistribution.

The input/output pads may include high-speed pads and low-speed pads. The input/output connection pads may include high-speed connection pads and low-speed connection pads. The high-speed pads may be connected to the input/output connection pads.

A low-speed redistribution layer may be formed on the active surface using redistribution and may be connected to the low-speed pad and the low-speed connection pad.

The chip pads may include a power/ground pad. A power/ground redistribution layer may be formed on the active surface and may be connected to a power/ground wiring of the internal circuits. The power/ground redistribution layer may have the power/ground connection pad. The power/ground redistribution layer may have a larger area than the other redistribution layer. The power/ground pad may be connected to the power/ground redistribution layer.

The stack chip may further include second through electrodes formed through the second chip and connected to chip pads of the second chip.

The semiconductor chip may be a center pad-type semiconductor chip.

Connection pads of the first chip may be electrically connected to connection pads of the second chip through metal bumps. The stack chip may include a filling layer interposed between the active surface of the first chip and the active surface of the second chip. The filling layer may be used in protecting the metal bumps.

According to another example embodiment of the invention, a stack chip may include a stack chip according to an example embodiment and a wiring substrate having an upper surface and a lower surface opposite to the upper surface. The stack chip may be mounted on the wiring substrate such that a back surface of a first chip of the stack chip may face the upper surface of the wiring substrate. The upper surface of the wiring substrate may be electrically connected to a connection end of a first through electrode of the stack chip. An encapsulant may encapsulate a raised portion of the upper surface of the wiring substrate including the stack chip. External connection terminals may be provided on the lower surface of the wiring substrate and may be electrically connected to the connection end of the first through electrode.

The stack chip package may further include electrical connection means connecting the connection end of the first through electrode to the wiring substrate. The electrical connection means may include connection bumps and bonding wires. If connection bumps are used, a filling layer may be interposed between the wiring substrate and the first chip of the stack chip and may be used in protecting the connection bumps. Spacers may be provided between the periphery of the back surface of the first chip and the upper surface of the wiring substrate.

If bonding wires are used, the wiring substrate may have a window through which the connection end of the first through electrode is exposed. The connection end of the first through electrode may be electrically connected to the wiring substrate through the bonding wires. The encapsulant may include a first encapsulant sealing the stack chip on the upper surface of the wiring substrate, and a second encapsulant sealing the window of the lower surface of the wiring substrate.

Although example, non-limiting embodiments of the invention have been described in detail hereinabove, it should be understood that many variations and/or modifications of the basic inventive concepts taught herein, which may appear to those skilled in the art, will still fall within the spirit and scope of the example embodiments of the invention as defined in the appended claims.

What is claimed is:

1. A stack chip comprising:
    a first semiconductor chip; and
    a second semiconductor chip stacked on the first semiconductor chip, wherein the first semiconductor chip includes:
        a first semiconductor substrate having a first active surface and a first back surface opposite to the first active surface;
        at least one first internal circuit disposed in the first active surface of the first semiconductor substrate;
        at least one first chip pad connected to the first internal circuit via an input/output buffer, the at least one first chip pad including a first input/output pad; and
        at least one first connection pad disposed on the first active surface of the first semiconductor substrate and connected to the at least one first chip pad, the at least one first connection pad including at least one first input/output connection pad connected to the first internal circuit,
    wherein the at least one first connection pad of the first semiconductor chip is electrically connected to at least one second connection pad of the second semiconductor chip, and at least one of the first and second semiconductor chips has a first through electrode, the first through electrode having a connection end exposed from a back surface of the at least one of the first and second semiconductor chips.

2. The stack chip of claim 1, wherein the second semiconductor chips includes:
    a second semiconductor substrate having a second active surface and a second back surface opposite to the second active surface;
    at least one second internal circuit disposed in the second active surface of the second semiconductor substrate;
    at least one second chip pad including a second input/output pad; and
    wherein the at least one second connection pad is disposed on the second active surface of the second semiconductor substrate and is connected to the at least one second chip pad, the at least one second connection pad including at least one second input/output connection pad connected to the second internal circuit.

3. The stack chip of claim 2, wherein the first semiconductor chip and the second semiconductor chip are stacked face-to-face.

4. The stack chip of claim 1, wherein the at least one first chip pad includes a high-speed pad and a low-speed pad and the high-speed pad is connected to the first input/output connection pad.

5. The stack chip of claim 4, further comprising a low-speed redistribution layer disposed on the first active surface and connected to the low-speed pad, wherein one end of the low-speed redistribution layer includes a low-speed connection pad.

6. The stack chip of claim 5, further comprising a power-ground redistribution layer disposed on the first active surface and connected to a power/ground wiring of the first internal circuit, the power/ground redistribution layer having a power/ground connection pad,
    wherein the power/ground redistribution layer has a larger area than the low-speed redistribution layer.

7. The stack chip of claim 6, wherein the at least one first chip pad includes a power/ground pad, the power/ground pad being connected to the power/ground redistribution layer.

8. The stack chip of claim 2, wherein the first through electrode is disposed in the first semiconductor chip and is connected to the first chip pad.

9. The stack chip of claim 8, further comprising a second through electrode disposed in the second semiconductor chip and connected to the second chip pad of the second semiconductor chip.

10. The stack chip of claim 1, wherein the first connection pad is electrically connected to the second connection pad through a metal bump.

11. The stack chip of claim 10, further including a filling layer interposed between the first active surface and the second active surface and configured to protect the metal bump.

12. The stack chip of claim 1, wherein the first connection pad is electrically connected to the second connection pad through an anisotropic conductive film.

13. A stack chip comprising:
    a first semiconductor chip; and
    a second semiconductor chip stacked on the first semiconductor chip in an offset configuration, wherein the first semiconductor chip includes:
        a first semiconductor substrate having a first active surface and a first back surface opposite to the first active surface;
        at least one first internal circuit disposed in the first active surface of the first semiconductor substrate;
        at least one first chip pad connected to the first internal circuit via a first input/output buffer, the at least one first chip pad including a first input/output pad; and
        at least one first connection pad disposed on the first active surface and connected to the at least one first chip pad, the at least one first connection pad including at least one first input/output connection pad connected to the first internal circuit,
    wherein the at least one first connection pad is electrically connected to at least one second connection pad of the second semiconductor chip, and at least one of the first and second semiconductor chips has a first through electrode, the first through electrode having a connection end exposed from a back surface of the at least one first and second semiconductor chip.

14. The stack chip of claim 13, wherein the second semiconductor chip includes:
- a second semiconductor substrate having a second active surface and a second back surface opposite to the second active surface;
- at least one second internal circuit disposed in the second active surface of the second semiconductor substrate;
- at least one second chip pad connected to the second internal circuit via a second input/output buffer; and
- the at least one second chip pad including a second input/output pad,
- wherein the at least one second connection pad is disposed on the second active surface of the second semiconductor substrate and is connected to the at least one second chip pad, the second connection pad including at least one second input/output connection pad connected to the second internal circuit.

15. The stack chip of claim 14, wherein the first through electrode is disposed in the first semiconductor chip and is connected to the first chip pad.

16. The stack chip of claim 15, further comprising a second through electrode disposed in the second semiconductor chip and connected to the second chip pad of the second semiconductor chip.

17. The stack chip of claim 14, wherein the first through electrode is disposed in the second semiconductor chip and is connected to the second chip pad.

18. The stack chip of claim 13, wherein the at least one first chip pad includes a high-speed pad and a low-speed pad and the high-speed pad is connected to the first input/output connection pad.

19. The stack chip of claim 18, further comprising a low-speed redistribution layer disposed on the first active surface and connected to the low-speed pad, wherein one end of the low-speed redistribution layer includes a low-speed connection pad.

20. The stack chip of claim 19, further comprising a power-ground redistribution layer disposed on the first active surface and connected to a power/ground wiring of the first internal circuit, the power/ground redistribution layer having a power/ground connection pad,
wherein the power/ground redistribution layer has a larger area than the low-speed redistribution layer.

* * * * *